United States Patent
Mourad et al.

(10) Patent No.: US 6,369,533 B1
(45) Date of Patent: Apr. 9, 2002

(54) PILOTING CIRCUIT FOR AN INDUCTIVE LOAD IN PARTICULAR FOR A DC ELECTRIC MOTOR

(75) Inventors: Kamal Mourad, Turin; Gianfranco Bussolino, San Damiano d'Asti; Maurizio Avidano, Nichelino, all of (IT)

(73) Assignee: GATE S.p.A., Turin (IT)

( * ) Notice: Subject to any disclaimer, the term of this patent is extended or adjusted under 35 U.S.C. 154(b) by 0 days.

(21) Appl. No.: 09/548,623

(22) Filed: Apr. 13, 2000

(30) Foreign Application Priority Data

Jul. 2, 1999 (IT) .......................... TO99A0569
Jul. 2, 1999 (IT) .......................... TO99A0294

(51) Int. Cl.[7] .................... H02K 23/00; H02H 7/08; H02H 11/00
(52) U.S. Cl. .................... 318/254; 318/138; 318/139; 361/94; 363/58
(58) Field of Search .................... 318/254, 245, 318/430–449, 138, 439; 323/283, 284, 285, 89, 40, 58, 96; 327/110, 374, 377, 396, 442, 139; 307/116; 361/39, 94, 20–32, 154, 156, 159

(56) References Cited

U.S. PATENT DOCUMENTS 4,862,866 A * 9/1989 Calfus
4,933,805 A * 6/1990 Calfus
5,038,247 A * 8/1991 Kelley et al.
5,475,273 A * 12/1995 Paparo et al.
5,550,497 A * 8/1996 Carobolante
5,629,610 A * 5/1997 Pedrazzini et al.
5,859,769 A * 1/1999 Escudero
5,952,738 A * 9/1999 Miller
5,975,057 A * 11/1999 Repplinger et al.
5,995,349 A * 11/1999 Temple

FOREIGN PATENT DOCUMENTS

EP  0765021 A1 * 9/1996
EP  1052766 A2 * 5/2000

* cited by examiner

Primary Examiner—Paul Ip
(74) Attorney, Agent, or Firm—Sughrue Mion, PLLC

(57) ABSTRACT

A piloting circuit comprises a circuit branch which is intended to be connected to a DC voltage supply source in such a way as to receive a voltage of predetermined polarity, and in which the drain-source path of a (first) MOSFET transistor intended to receive an on-off piloting signal on its gate is connected in series with the load, a current recirculation diode connected in parallel to the load, and protection devices operable to prevent damage to the MOSFET transistor and/or the diode in the event of polarity reversal of the supply voltage. The protection function is achieved of an electronic switch disposed in series with the recirculation diode and piloted in such a way as to prevent the passage of current in this diode if a supply voltage of reversed polarity with respect to the predetermined polarity is applied to the said circuit branch.

14 Claims, 6 Drawing Sheets

PILOTING CIRCUIT FOR AN INDUCTIVE LOAD IN PARTICULAR FOR A DC ELECTRIC MOTOR

BACKGROUND OF THE INVENTION

The present invention relates to a piloting circuit for an inductive load, in particular for a DC electric motor.

More specifically, the subject of the invention is a piloting circuit comprising

- a circuit branch which is intended to be connected to a DC voltage supply source in such a way as to receive a voltage of predetermined polarity, and in which the drain-source path of a (first) MOSFET transistor intended to receive an on-off piloting signal at its gate, is disposed in series with the load,
- a current recirculation diode connected in parallel to the load, and
- protection circuit means operable to prevent damage to the said MOSFET transistor and/or the recirculation diode in the event of polarity reversal of the voltage supply source.

In FIG. 1 there is generally indicated a circuit of this type for piloting a DC electric motor. The circuit comprises a circuit branch 3 connected between the positive pole of a DC voltage supply source 4 such as a battery, and ground. The negative pole of this source is likewise connected to ground. In the circuit branch 3, in series with the electric motor 2, there is disposed the drain-source path of a MOSFET transistor 5 which receives an on-off piloting signal on the gate, such as a pulse width modulated signal (PWM), emitted by a control circuit 6. A diode 7 is connected in parallel with the motor 2 to allow the recirculation of the current when the transistor 5 is switched off.

In FIG. 1 the reference numeral 8 indicates the intrinsic or "parasitic" diode of the MOSFET transistor 5. This diode does not create problems if the DC supply voltage applied to the circuit 1 has the correct polarity as is shown in FIG. 1.

The intrinsic diode 8 of the MOSFET transistor 5 does create a problem, however, in the event of polarity reversal of the supply source voltage, as is shown in FIG. 2. As will be appreciated from this Figure, in the event of polarity reversal of the voltage supply source a current I flows through the diode 8 and recirculation diode 7. The magnitude of this current can reach an extremely high value, of hundreds of amps, in that this current is resisted solely by the electrical resistance of the connections between the source 4 and the said diodes, which resistance is in general rather low, of the order of tens of m Ohms. Such current is able to damage or even destroy the transistor 5 and the recirculation diode 7.

Various solutions have been proposed in the prior art to remedy the above indicated problem.

A first solution, shown in FIG. 3, consists in the insertion of a further diode 9 in series with the circuit branch 3, disposed in such a way as to oppose the flow of current in the case of polarity reversal of the supply voltage. However, when the polarity of the supply voltage is correct, the same current as flows in the motor 2 also flows in the diode 9, which can be of the order of several tens of amperes there is therefore a high dissipation of power in the diode 9 and this causes a reduction in the overall efficiency of the system and involves the adoption of provisions to allow this diode to be able to dissipate a high power.

In FIG. 4 there is shown a further prior art solution consisting in disposing a further diode 10 in parallel with the circuit branch 3, with its anode connected to ground, and a fuse 11 between this diode and the voltage source. If the polarity of the supply voltage is reversed the diode 10 and fuse 11 are traversed by a high current which in the limit can "blow" the fuse. This solution, although able effectively to protect the piloting circuit 1, does not allow the state of the fuse to be determined after a possible accidental reversal of the supply voltage. In any case, when the fuse has been blown it is necessary to provide for replacement of this latter in order to reinstate the functionality of the piloting circuits.

In the other known solution shown in FIG. 5, between the circuit branch 3 of the piloting circuit 1 and the voltage supply source is interposed the contact 12 of a relay the excitation winding 12a of which is connected to a circuit 13 which detects the polarity of the voltage delivered from the source. If the polarity is correct the circuit 13 excites the winding 12a, which causes closure of the contact 12 allowing supply of the piloting circuit of the motor 2. This solution is expensive in that it requires the use of high performance relays. It is moreover affected by all the known problems to which electromechanical switching devices are subject, such as the possibility of sticking of the movable contact of the relay on the associated fixed contact etc.

SUMMARY OF THE INVENTION

An object of the present invention is to provide a piloting circuit of the previously defined type, able to prevent damage to the MOSFET transistor and/or the recirculation diode associated with the load in a simple but reliable way in the event of reversal of the supply voltage polarity.

This and other objects are achieved according to the invention with the piloting circuit the salient characteristics of which are defined hereinafter.

BRIEF DESCRIPTION OF THE DRAWINGS

Further characteristics and advantages of the invention will become apparent from the following detailed description given purely by way of non-limitative example with reference to the attached drawings, in which.

DETAILED DESCRIPTION OF THE INVENTION

Figure 1:
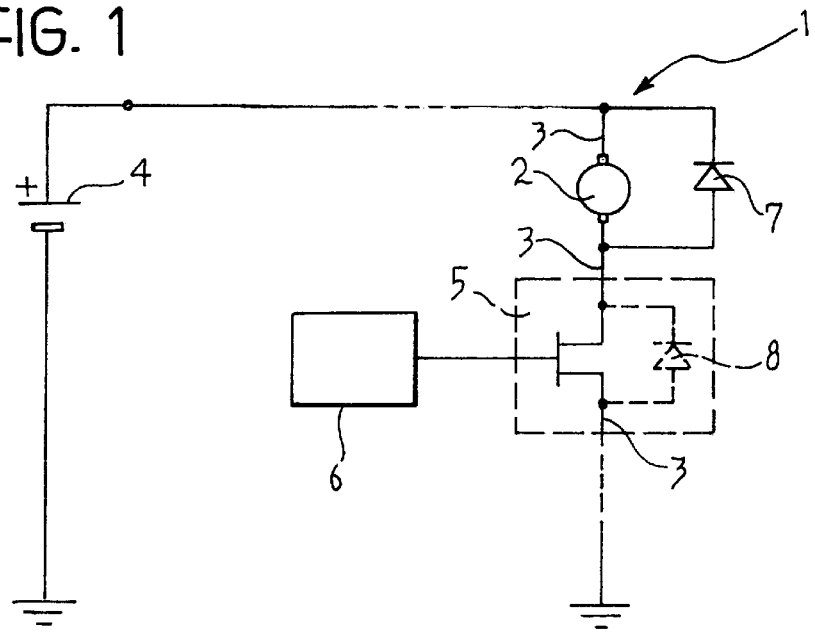
FIGS. 1 and 2, already described, show a prior art piloting circuit for a DC electric motor, connected to a voltage supply with the correct polarity and reversed polarity respectively.
Figure 2:
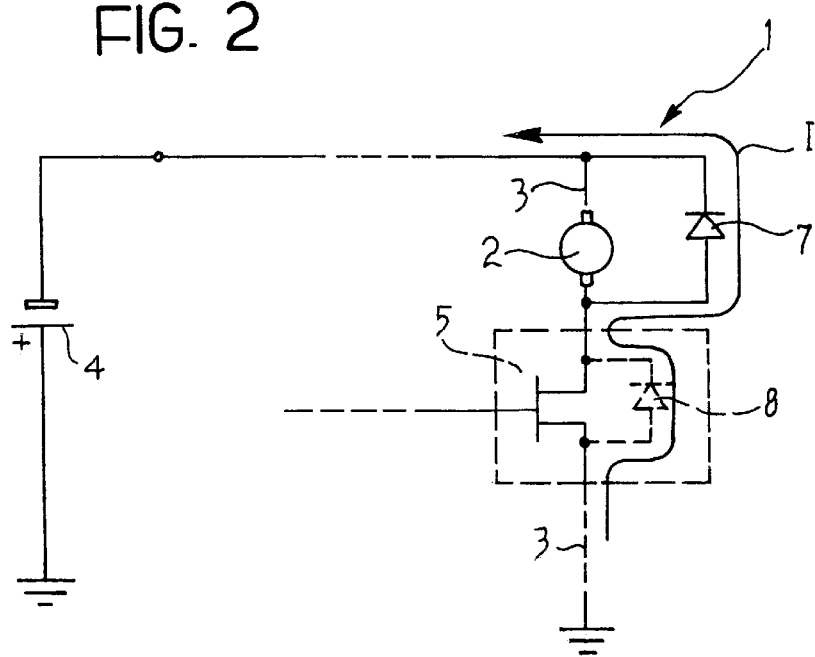
Figure 3:
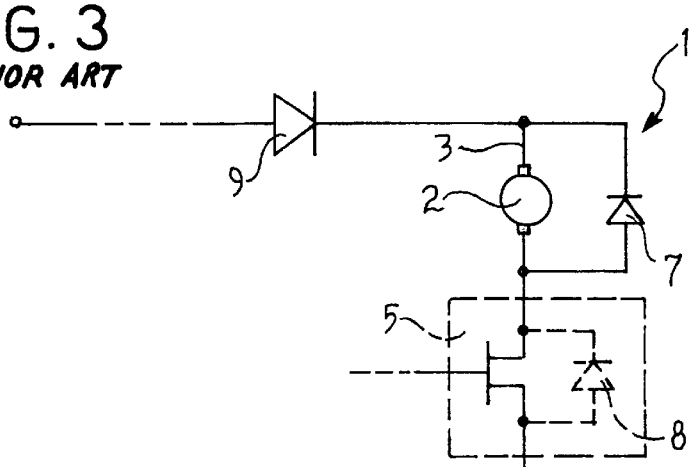
FIGS. 3 to 5, also already described, show prior art solutions for protection against polarity reversal of the supply voltage.
Figure 4:
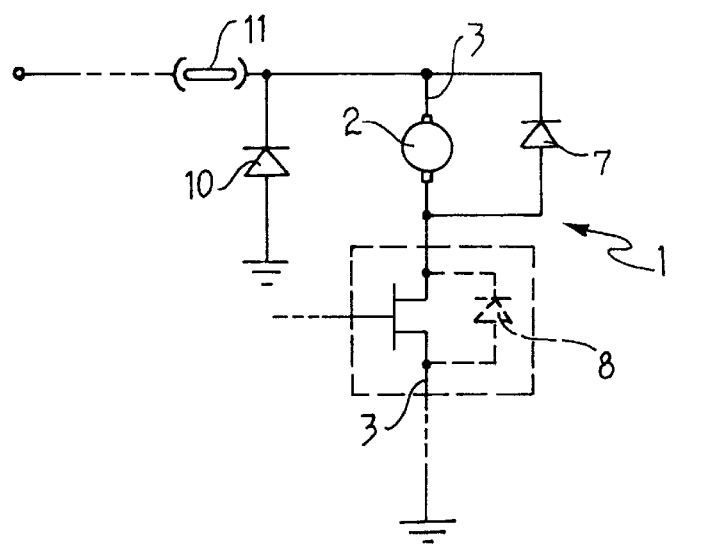
Figure 5:
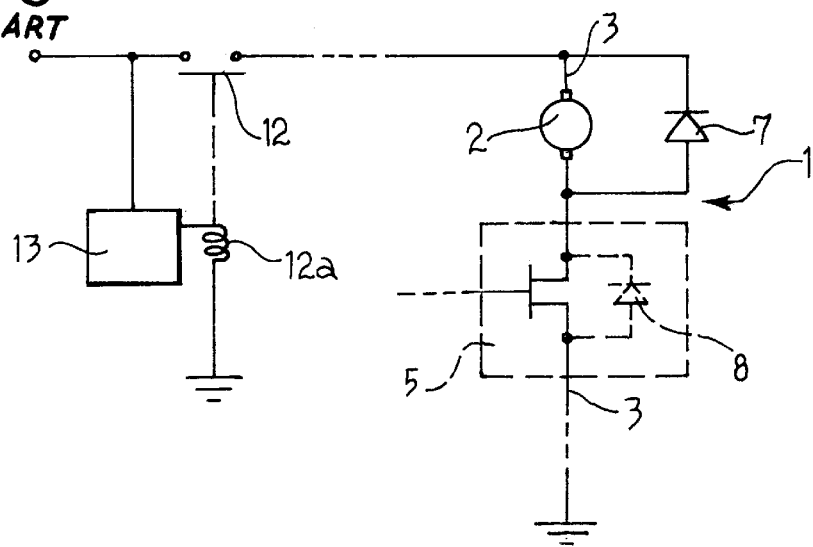
Figure 6:
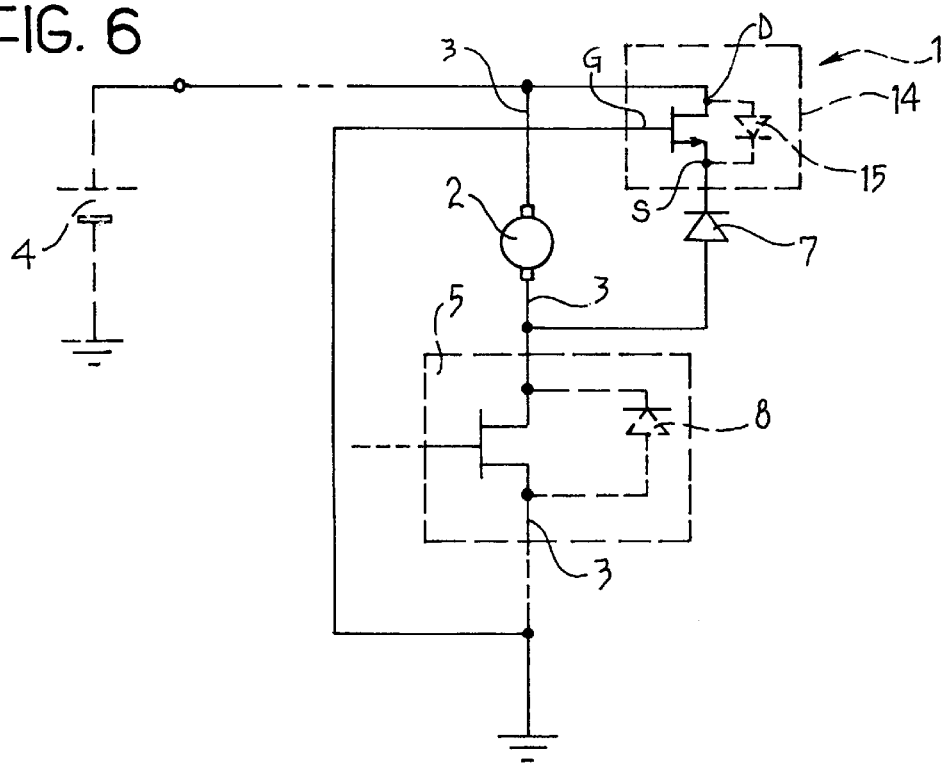
FIGS. 6 and 7 illustrate two embodiments of a piloting circuit according to the invention.
Figure 7:
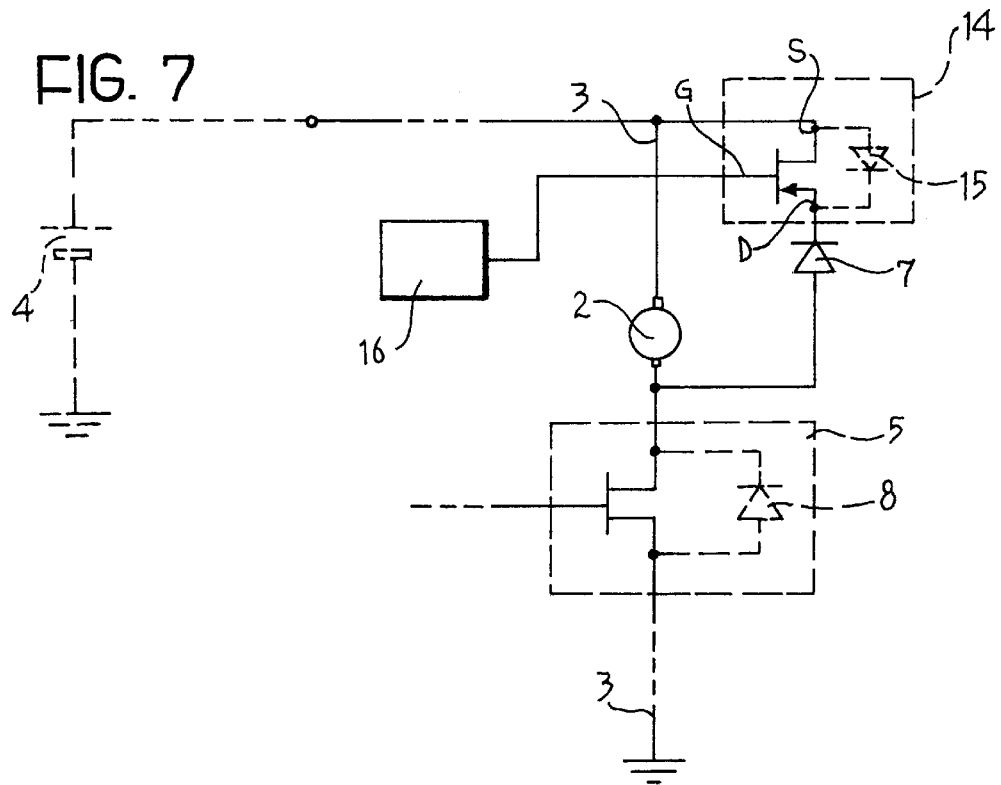

With reference to FIGS. 6 and 7, the solution according to the invention essentially consists in disposing, in series with the recirculation diode 7 associated with the electric motor 2, an electronic switch 14 piloted in such a way as to prevent the passage of current in the said recirculation diode when the circuit branch 3 has a reverse polarity voltage supply applied thereto with respect to the intended polarity. With this solution, if the circuit branch 3 has a reverse polarity voltage supply applied thereto the current flows in the intrinsic diode 8 of the main MOSFET transistor 5 and then in the motor 2. This current cannot reach dangerous values in that it is limited not only by the electrical resistance of the connections, but rather is above all limited by the motor itself. The said current causes rotation of the motor in a reverse sense with respect to that envisaged for normal operation. Moreover, this rotation takes place at the maximum design speed. This makes it possible to be able quickly to detect if the supply circuit is incorrectly converted to the piloting circuit.

In the preferred embodiment shown in FIGS. 6 and 7 the electronic switch 14 is constituted by a second MOSFET transistor the drain-source path D-S of which is disposed in series with the recirculation diode 7 in such a way that the parallel instrinsic diode 15 of this MOSFET transistor 14 is disposed in opposition to the recirculation diode 7.

In the embodiment shown in FIG. 6 the MOSFET transistor 14 is of the p channel type and has its gate G connected to the terminal of the circuit branch 3 which is intended to be connected to the negative pole of the voltage source 4.

In the event of supply voltage reversal, the MOSFET transistor 14 automatically intervenes since in this case the voltage between its gate and source becomes positive immediately. In other words, this transistor does not require biasing or piloting.

In the variant of FIG. 7 the MOSFET transistor 14 is of the n channel type, and has its gate G connected to the output of a charge pump 16 operable to render positive the potential difference between the gate and the source when the circuit branch 3 has a supply voltage of reversed polarity applied thereto.

Figure 8:
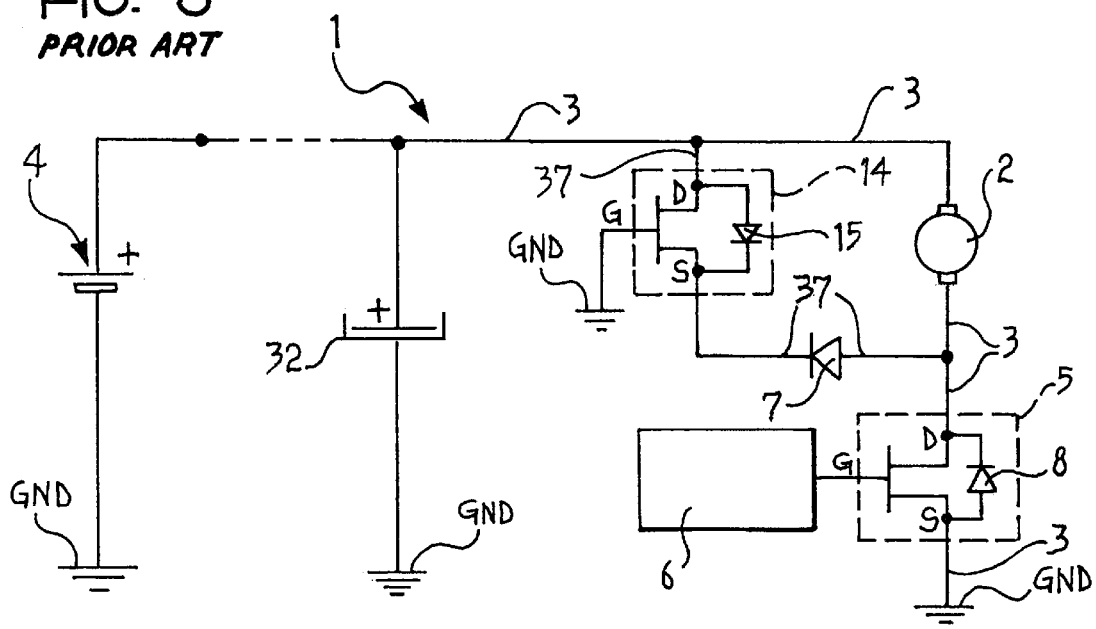
FIG. 8 shows a circuit with a filter capacitor.

In FIG. 8 of the attached drawings there is shown essentially the same circuit as in FIG. 6, to which there has been added a filter capacitor 32 of polarised type in parallel with the voltage source 4.

Typically the capacitor 32 has a rather high capacity and is usually constituted by an electrolytic capacitor.

In the circuit of FIG. 8, if the circuit branch 3 which pilots the load 2 is accidentally connected with a reverse polarity to the voltage supply source, that is to say a voltage source with its positive pole to ground, the current generated by this source flows through the intrinsic diode 8 of the main MOSFET transistor 5 and then into the motor 2. This current cannot reach dangerous values in that it is limited by the impedence of the electric motor 2 itself. The current cannot flow in the recirculation circuit branch 37 in that in the case of polarity reversal of the supply voltage the MOSFET transistor 14 is turned off, and moreover the intrinsic diode 15 of this MOSFET transistor opposes the flow of current.

In the case of accidental polarity reversal of the supply voltage the current which, as is described above, flows through the electric motor 2 causes rotation of this latter in the opposite sense from the intended direction for normal operation. Moreover, this rotation takes place at maximum design speed. This makes it possible quickly to detect the condition of the erroneous connection of the supply voltage to the piloting circuit.

The MOSFET protection transistor 14 may be of the n channel type. In this case, as described with reference to FIG. 7, the gate of this MOSFET protection transistor must be piloted by means of a charge pump. With the circuit according to FIG. 8, in the event of polarity reversal of the supply voltage, the MOSFET transistor 14 allows the intrinsic diode 8 of the main MOSFET transistor 5 and the recirculation diode 7 to be protected. In this case the filter capacitor 32 is, on the other hand, not protected. Accidental polarity reversal of the supply voltage can seriously damage this capacitor.

It is therefore a further object of the present invention to propose a piloting circuit of the type initially defined, improved in such a way as to guarantee at the same time also an effective protection of the polarised filter.

Figure 9:
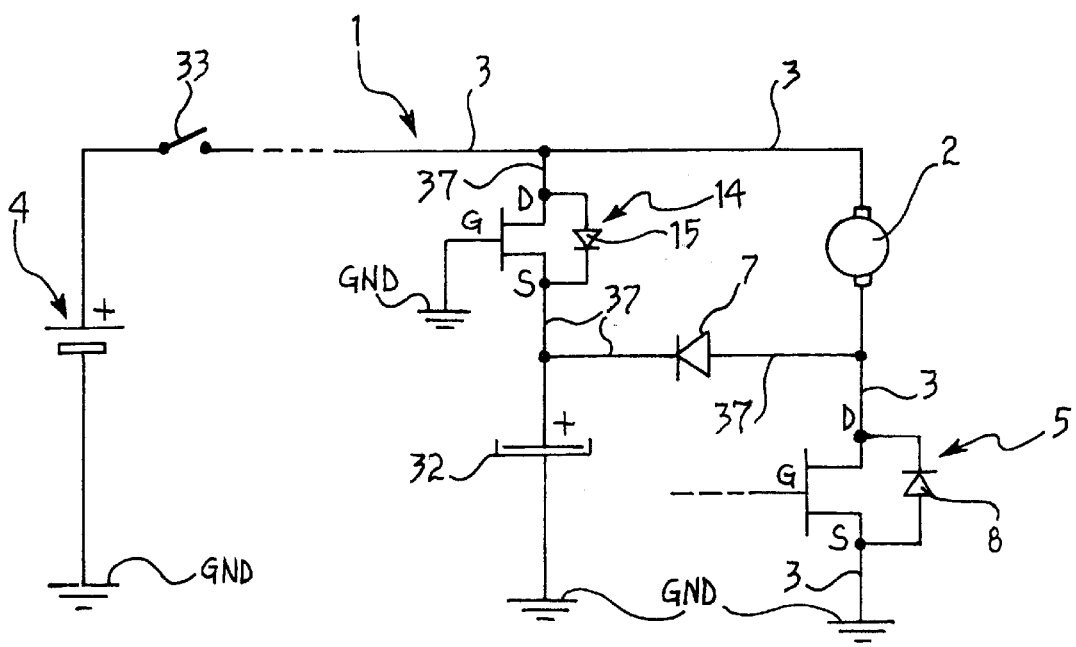
FIG. 9 shows another piloting circuit according to the invention.

In FIG. 9 there is therefore shown a further piloting circuit 1 according to the invention. In this Figure the parts and elements already described have again been attributed the same numerals or alphanumeric reference symbols.

In the circuit 1 according to FIG. 9 the polarised filter capacitor 32 is connected between the cathode of the recirculation diodes 7 and ground GND.

Thanks to this arrangement, if the circuit branch 3 which pilots the load 2 is accidentally connected to a supply voltage of opposite polarity from that intended and illustrated, the MOSFET protection transistor 14 is turned off and prevents the flow reverse polarity of current in the recirculation circuit branch 37. Consequently, the whole of the supply voltage is not applied across the terminals of the filter capacitor 32, but rather only the modest voltage drop which occurs across the intrinsic diode 8 of the main MOSFET transistor 5. This voltage drop, of the order of 0.6 Volts, is not capable of compromising the said capacitor, which is therefore effectively protected against accidental polarity reversal of the supply voltage.

With the piloting circuit 1 of FIG. 9, when the voltage source 4 (of correct polarity) is coupled to the circuit branch 3, for example following closure of a switch 33, the filter capacitor 32, which is initially discharged, charges very rapidly as a consequence of the flow of a current through the intrinsic diode 15 of the MOSFET protection transistor 14. The pulsed charging current of the capacitor 32 can reach a rather high peak value, for example of the order of hundreds of amps. In order to support such a current the diode 15 (and of course the MOSFET protection transistor 14) must be adequately dimensioned and consequently expensive.

Figure 10:
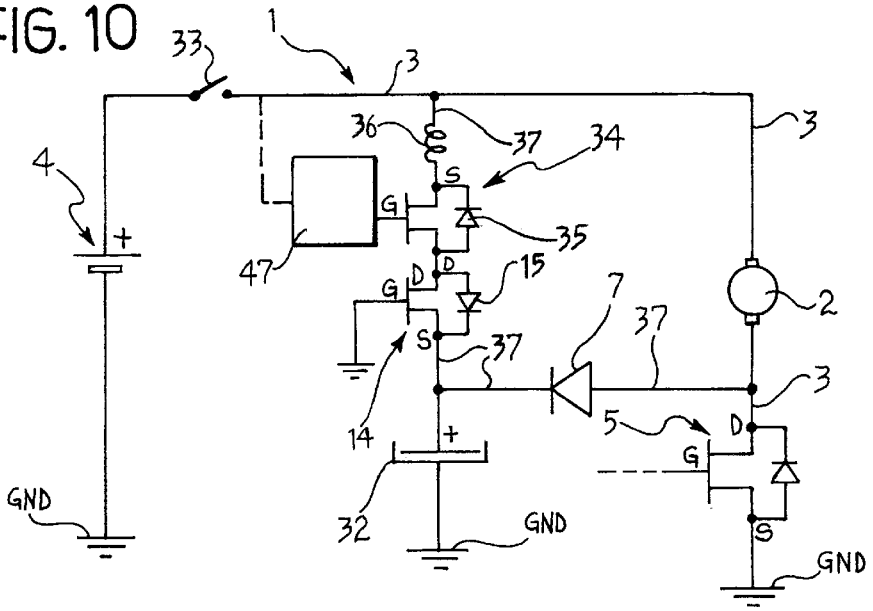
FIGS. 10 and 11 are other diagrams of other piloting circuits according to the invention.

In FIG. 10 there is shown a variant embodiment which makes it possible to utilise a MOSFET protection transistor 14 of low current type which is therefore decidedly more economical. In FIG. 10, too, the parts and elements already described are again allocated the same alphanumeric reference symbols already utilised.

In the arrangement according to FIG. 10, in the current recirculation circuit branch 37, in series with the electronic protection switch 14 there is fitted a second switch indicated 34. The switch 34, is in particular, a MOSFET transistor the source-drain path of which is connected in series with the drain-source path of the MOSFET transistor 14. The intrinsic diode 35 of the MOSFET transistor 34 is in opposition to the intrinsic diode 15 of the MOSFET transistor 14. The MOSFET transistor 34 has its source connected to the positive pole of the supply source (obviously when the switch 33 is closed). Between the source of the MOSFET transistor 34 and the supply source there may conveniently be interposed an inductance 36 which makes it possible to limit the power dissipation in the MOSFET transistors 14 and 34.

The MOSFET transistor 34 may be of the p channel type or of the n channel type. In the first case the gate of the MOSFET transistor 34 is connected to the output of a delay circuit 47 such that when the voltage source 4 is coupled to the piloting circuit 1 this delay circuit 47 prevents the said MOSFET transistor 34 from becoming conductive for a predetermined time period. During this time period after closure of the switch 33, the filtering capacitor 32 charges due to the passage of a current which flows through the motor 2 and the recirculation diode 7. The charging current of the capacitor 32 is therefore limited by the impedence of the load 2 itself.

After the predetermined time period the delay circuit 47 allows the MOSFET transistor 34 to become conductive and the charge of the filtering capacitor 32 can then become completed through the (possible) filter inductance 36, the source-drain path of the MOSFET transistor 34 and the intrinsic diode 15 of the MOSFET transistor 14.

If the MOSFET transistor 34 is of n channel type its gate is conveniently connected to the output of a charge pump operable intrinsically to delay it from becoming conductive.

In each case both the MOSFET protection transistors 14 and 34 of the circuit of FIG. 10 can be of the economical low current type.

Figure 11:
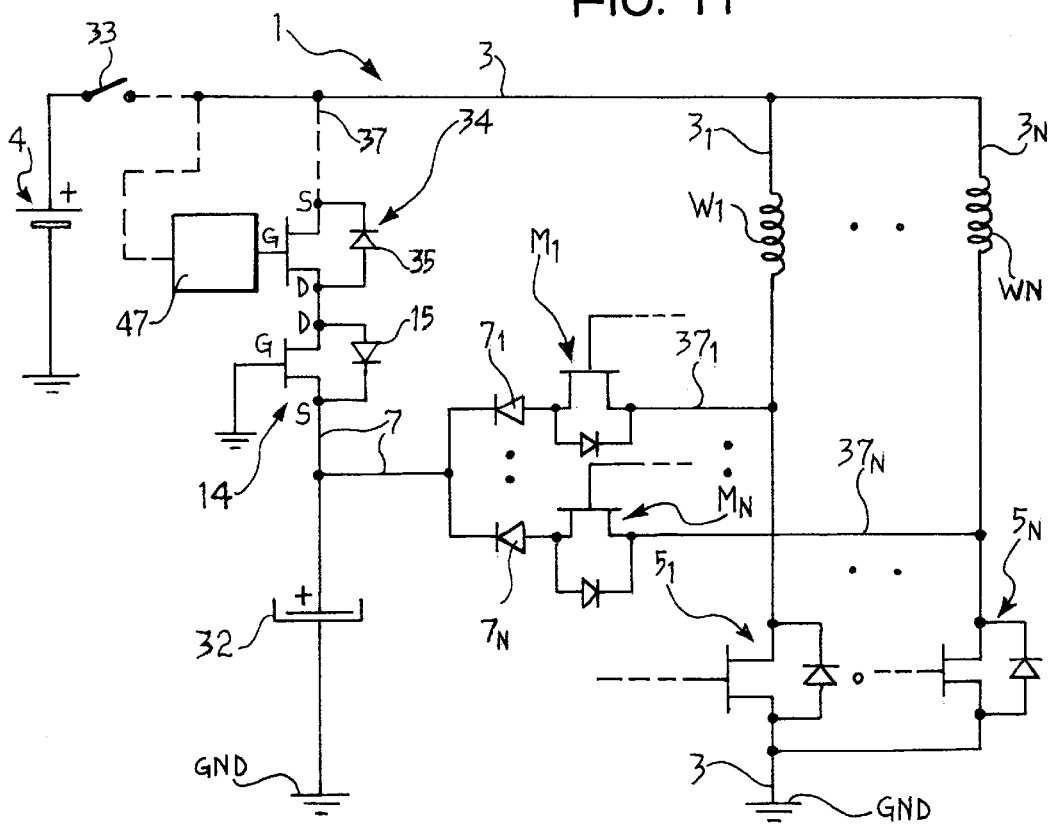

In FIG. 11 there is shown a circuit similar to that shown in FIG. 10, for piloting a brushless half-wave electric motor comprising a plurality of windings or phases W1 to WN disposed in respective circuit branches 31 to 3N, in series with respective MOSFET piloting transistors 51 to 5N. Each winding or phase of the brushless motor is associated with respective recirculation diodes 71 to 7N connected with their cathodes in common to the positive armature of the filter capacitor 32 in respective circuit sub-branches 371 to 37N, possibly including respective MOSFET transistors M1 to MN for control of the recirculation of the phase currents.

In the circuit according to FIG. 11 the MOSFET transistor 34 ensures that, immediately after closure of the switch 33, the filter capacitor 32 charges slowly by means of a current flowing in the winding or phase of the brushless motor which is conductive, whilst the associated recirculation switch M is conductive. For the purpose of controlling the gradualness of the charging of the capacitor 32 the recirculation MOSFET transistors M1 to MN can be piloted in a controlled manner, for example by means of respective pulse width modulated signals (PWM).

For the rest the circuit of FIG. 11 operates similarly to the circuit already described with reference to FIG. 10.

A control transistor may be disposed in series with the recirculation diode in the circuit of FIG. 10: this control transistor, held open contemporaneously with the MOSFET transistor 34, makes it possible to eliminate the leakage current of the capacitor 32 from the voltage supply line which connects the source to the piloting circuit.

Figure 12:
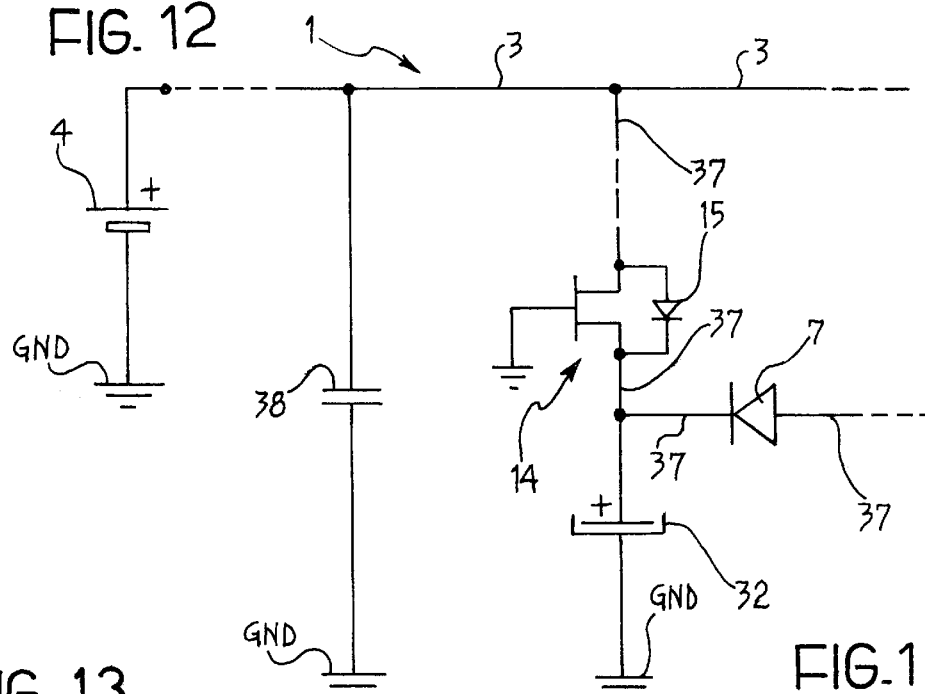
FIG. 12 is a partial representation of a further circuit according to the invention.

In piloting circuits for inductive loads according to the invention it may be suitable, for the purpose of obtaining an effective filtering of the supply voltage, to dispose in parallel with the voltage source 4 a further filter capacitor of small capacity (for example a tenth) with respect to that of the polarised capacitor 32. Such an additional capacitor is indicated with reference numeral 38 in FIG. 12.

The capacitor 18 may be of non-polarised type and therefore not susceptible to damage in the case of accidental polarity reversal of the supply voltage.

Figure 13:
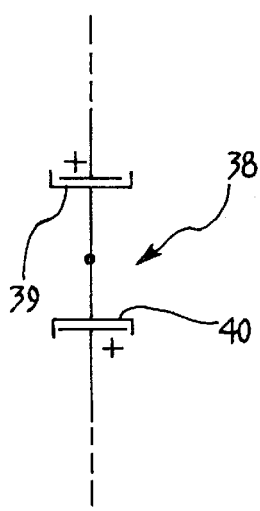
FIGS. 13 and 14 show a connection of a polarised "series opposition" capacitor usable in a circuit according to the invention.
Figure 14:
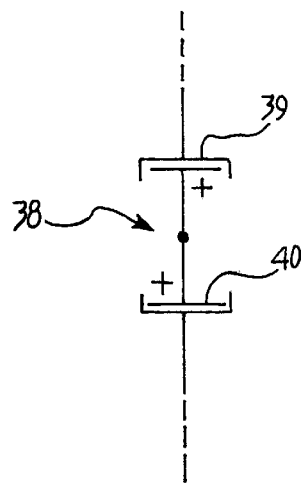

The additional capacity in parallel with the voltage source 4 may however also be provided as a pair of polarised capacitors 39 and 40 connected in "anti-series", that is to say connected together in series with their corresponding terminals interconnected, as is shown in FIGS. 13 and 14.

Figure 15:
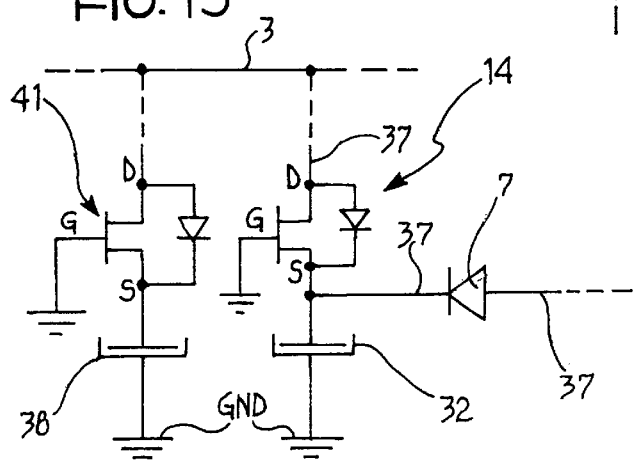
FIG. 15 is a partial diagram of a further alternative embodiment of a piloting circuit according to the invention.

If it is desired to form the additional capacity 38 using a further single polarised capacitor, this latter may be protected against accidental polarity reversal of the supply voltage by an associated MOSFET transistor 41 connected for example in the manner illustrated in FIG. 15. In this Figure the MOSFET transistor 41 is of p channel type and its gate is connected to ground GND. This MOSFET transistor may however be of n channel type and in this case its gate must be coupled to a charge pump.

Naturally, the principle of the invention remaining the same, the embodiments and the details of construction may be widely varied with respect to what has been described and illustrated purely by way of non-limitative example, without by this departing from the ambit of the invention as defined in the attached claims.

In particular, with modifications obvious to those skilled in this art, the invention is also applicable to circuits for piloting inductive loads supplied with a voltage the positive pole of which is connected to ground.

What is claimed is:

1. A circuit for piloting an inductive load, in particular for a DC electric motor, comprising
    a circuit branch connected to a DC voltage supply source to receive a voltage of predetermined polarity, and in which, in series with a load, there is disposed a drain-source path of a first MOSFET transistor intended to receive an on-off piloting signal on its gate,
    a current recirculation diode connected in parallel to the load, and
    protection circuit means operable to prevent damage to said first MOSFET transistor and the recirculation diode in the event of polarity reversal of the supply voltage;
    said protection circuit means comprising a first electronic switch disposed in series with the recirculation diode and piloted to prevent the flow of current in said recirculation diode when a supply voltage of reversed polarity with respect to said predetermined polarity is applied to said circuit branch.

2. A circuit according to claim 1, wherein said electronic switch includes a second MOSFET transistor the drain-source path of which is disposed in series with the recirculation diode with the intrinsic parallel diode of said second MOSFET transistor disposed in opposition to the recirculation diode.

3. A circuit according to claim 2, in which said second MOSFET transistor is of p channel type and its gate is connected to the terminal of said circuit branch which is connected to the negative pole of the voltage supply source.

4. A circuit according to claim 2, in which said second MOSFET transistor is of n channel type and its gate is connected to an output of a charge pump so that the voltage between the gate and the source of said second MOSFET transistor becomes positive when a supply voltage of reversed polarity is applied to said circuit branch.

5. A circuit according to claim 1, comprising
    a circuit branch for piloting the load, which is connected to a DC coltage supply source to receive a supply voltage of predetermined polarity, and in which the drain-source path of the first MOSFET transistor receives an on-off piloting signal on its gate is connected,
    a recirculation circuit branch connected in parallel with the load and in which there are provided a recirculation diode and, between the recirculation diode and on pole of the voltage source, the first electronic protection switch is operatively piloted to prevent the flow of current in the recirculation diode when a supply voltage of reverse polarity with respect to said predetermined polarity is accidentally applied to the pilot circuit branch, and at least one filter capacitor of a polarised type connected in parallel with the voltage source;

said filter capacitor being connected between said recirculation diode and the other pole of the voltage source.

6. A circuit according to claim 5, in which a second electronic protection switch is connected in the current recirculation circuit branch, in series with said first electronic protection switch, said second electronic protector switch, when the voltage source is coupled to said piloting circuit branch, is operable to prevent, for a predetermined period of time, the flow of current through said first electronic protection switch, during said period of time, said filter capacitor being charged with a current which also flows through the load.

7. A circuit according to claim 2, in which said second electronic protection switch is a third MOSFET transistor the source-drain path of which is in series with the drain-source path of said second MOSFET transistor and the gate of which is connected to a polarisation circuit operable to render it conductive with a predetermined delay after coupling of the voltage source to said piloting circuit branch.

8. The circuit according to claim 7, in which said third MOSFET transistor is a p channel type the gate of which is connected to the output of a delay circuit.

9. A circuit according to claim 7, in which said third MOSFET transistor is of n channel type the gate of which is connected to the output of a charge pump.

10. A circuit according to claim 5, in which a filter inductor is connected in the recirculation circuit branch in series with said electronic protection switch, operable to limit the dissipation of power in said electronic protection switch.

11. A circuit according to claim 5, in which further capacitive means having a lower capacity than that of said polarised capacitor are disposed in parallel with the piloting circuit branch.

12. A circuit according to claim 11, in which said further capacitive means comprise two polarised capacitors connected in series opposition.

13. A circuit according to claim 11, in which said further capacitive means comprise a further polarised capacitor in series with which is disposed an associated electronic protection switch operable to prevent damage to said further polarised capacitor in the event of polarity reversal of the supply voltage.

14. A circuit according to claim 6, in which said second electronic protection switch is a third MOSFET transistor the source-drain path of which is in series with the drain-source path of said second MOSFET transistor and the gate of which is connected to a polarisation circuit operable to render it conductive with a predetermined delay after coupling of the voltage source to said piloting circuit branch.

* * * * *